(12) United States Patent
Choi et al.

(10) Patent No.: US 10,867,828 B2
(45) Date of Patent: Dec. 15, 2020

(54) MARKING POSITION CORRECTING APPARATUS AND METHOD

(71) Applicant: EO TECHNICS CO., LTD., Anyang-si (KR)

(72) Inventors: Sang Chul Choi, Seoul (KR); Soo Young Kim, Anyang-si (KR); Sun Youp Lee, Anyang-si (KR); Sung Beom Jung, Anyang-si (KR); Seung Kwan Choi, Anyang-si (KR)

(73) Assignee: EO TECHNICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/998,575

(22) PCT Filed: Apr. 27, 2016

(86) PCT No.: PCT/KR2016/004391
§ 371 (c)(1),
(2) Date: Aug. 15, 2018

(87) PCT Pub. No.: WO2017/142132
PCT Pub. Date: Aug. 24, 2017

(65) Prior Publication Data
US 2019/0259645 A1      Aug. 22, 2019

(30) Foreign Application Priority Data

Feb. 15, 2016   (KR) .................. 10-2016-0017184

(51) Int. Cl.
*H01L 21/68* (2006.01)
*H01L 21/268* (2006.01)
(Continued)

(52) U.S. Cl.
CPC .......... *H01L 21/681* (2013.01); *H01L 21/268* (2013.01); *H01L 21/67282* (2013.01); *H01L 23/544* (2013.01)

(58) Field of Classification Search
CPC ..................................................... H01L 21/681
(Continued)

(56) References Cited

U.S. PATENT DOCUMENTS

| 6,808,117 | B2 | 10/2004 | Han et al. | |
| 2002/0149765 | A1* | 10/2002 | Fujii | .................. G01N 21/9501 356/237.5 |

(Continued)

FOREIGN PATENT DOCUMENTS

| JP | S58-023448 A | 2/1983 |
| JP | S61-135136 A | 6/1986 |

(Continued)

OTHER PUBLICATIONS

Korean Notice of Allowance for Korean Patent Application No. 9-5-2017-087934690, dated Dec. 15, 2017.
(Continued)

*Primary Examiner* — Tarifur R Chowdhury
*Assistant Examiner* — Omar H Nixon
(74) *Attorney, Agent, or Firm* — Buchanan Ingersoll & Rooney PC

(57) ABSTRACT

Provided is an apparatus and method for correcting a marking position, in which, by measuring and correcting a marking position by using a processing film for position correction, marking may be accurately performed on a position on a semiconductor chip during a marking operation, before a marking operation is performed on semiconductor chips provided on a wafer. The apparatus for correcting a marking position of a wafer includes a support configured to support a processing film for position correc- (Continued)

tion, a laser head configured to emit a laser beam to the processing film for position correction to form a pattern, a vision camera configured to obtain pattern position information, a movable table configured to move the support in a horizontal direction, and a controller configured to compare and match the pattern position information and marking position information set in the laser head.

18 Claims, 8 Drawing Sheets

(51) Int. Cl.
*H01L 21/67* (2006.01)
*H01L 23/544* (2006.01)

(58) Field of Classification Search
USPC .......................................................... 356/614
See application file for complete search history.

(56) References Cited

U.S. PATENT DOCUMENTS

| | | | |
|---|---|---|---|
| 2003/0032256 A1 | 2/2003 | Lee et al. | |
| 2004/0121493 A1 | 6/2004 | Han et al. | |
| 2004/0152233 A1 | 8/2004 | Nemets et al. | |
| 2006/0106497 A1* | 5/2006 | Ishikawa | B25J 9/1697 700/259 |
| 2006/0243711 A1 | 11/2006 | Paradis et al. | |
| 2008/0102200 A1* | 5/2008 | Doki | H01L 21/67259 427/240 |
| 2011/0000898 A1* | 1/2011 | Rumsby | B23K 26/032 219/121.72 |
| 2011/0132885 A1 | 6/2011 | Sercel et al. | |
| 2011/0242697 A1* | 10/2011 | Mori | G11B 5/314 360/59 |
| 2012/0013788 A1* | 1/2012 | Ogata | G03F 7/70791 348/362 |

FOREIGN PATENT DOCUMENTS

| | | |
|---|---|---|
| JP | S63-046744 A | 2/1988 |
| JP | H02-037740 A | 2/1990 |
| JP | H03-208363 A | 9/1991 |
| JP | H06-326203 A | 11/1994 |
| JP | 2002-343699 A | 11/2002 |
| JP | 2003-188059 A | 7/2003 |
| KR | 10-2004-0056670 A | 7/2004 |
| KR | 10-2005-0024275 A | 3/2005 |
| KR | 10-2008-0003445 A | 1/2008 |
| KR | 10-2011-0116894 A | 10/2011 |

OTHER PUBLICATIONS

Korean Office Action for Korean Patent Application No. 9-5-2017-087934690, dated Jul. 2, 2017.
Taiwanese Office Action for Taiwanese Patent Application No. 105113794, dated Apr. 5, 2017.
International Search Report (PCT/ISA/210) dated Oct. 31, 2016, by the Korean Patent Office as the International Searching Authority for International Application No. PCT/KR2016/004391.
Written Opinion (PCT/ISA/237) dated Oct. 31, 2016, by the Korean Patent Office as the International Searching Authority for International Application No. PCT/KR2016/004391.

* cited by examiner

MARKING POSITION CORRECTING APPARATUS AND METHOD

TECHNICAL FIELD

The present invention relates to an apparatus and method for correcting a marking position of a wafer, and particularly, to an apparatus and method for correcting a marking position by emitting a laser beam to a processing film for position correction before processing a wafer.

BACKGROUND ART

Many chips are formed on a wafer in a manufacturing process of a semiconductor device. To distinguish chips by production lot, characters and/or numbers are marked on a surface of each chip. For this purpose, a laser-marking apparatus that employs a laser beam is used. Previously, a lot number was marked on each chip after dicing, but with the development of advanced technology, integrated circuits (ICs) are able to be made compact and light. Accordingly, to improve operation efficiency and enable mass production, dicing is performed after individual chips are marked on a wafer.

To accurately mark a chip on a wafer, alignment of the wafer is important. The alignment of a wafer is to position a wafer at a marking position with respect to geometrical characteristics or a tag of a wafer. A marking process is performed by recognizing a recognition feature (a ball array, a recognition mark, etc.) of a wafer in an optical method, converting marking data according to a marking position, and emitting a laser beam to the marking position by using an appropriate optical system. In this regard, to mark a chip having a size less than or equal to 1 mm$^2$, it is necessary to accurately recognize a position of a chip and emission of a laser beam. However, even when a position of a wafer and emission of a laser beam are accurately recognized during an initial marking operation, the emission position of a laser beam may be changed over time due to an external disturbance such as vibration or heat. Accordingly, it is necessary that a laser marking apparatus performs a marking position correction operation before a marking operation is performed on a wafer.

DETAILED DESCRIPTION OF THE INVENTION

Technical Problem

Provided is an apparatus and method for correcting a marking position by emitting a laser beam to a processing film for position correction to form a pattern, obtaining pattern position information by using a vision camera, and comparing the pattern position information and marking position information set in a laser head.

Technical Solution

According to an aspect of the present disclosure, an apparatus for correcting a marking position of a wafer includes a support configured to support a processing film for position correction, a laser head configured to emit a laser beam to the processing film for position correction to form a pattern, a vision camera configured to obtain pattern position information, a movable table configured to move the support in a horizontal direction, and a controller configured to compare and match the pattern position information and marking position information set in the laser head.

Advantageous Effects of the Invention

According to the present disclosure, by measuring and correcting a marking position by using a processing film for position correction, marking may be accurately performed on a position on a semiconductor chip during a marking operation, before a marking operation is performed on semiconductor chips provided on a wafer.

BEST MODE

Figure 1:
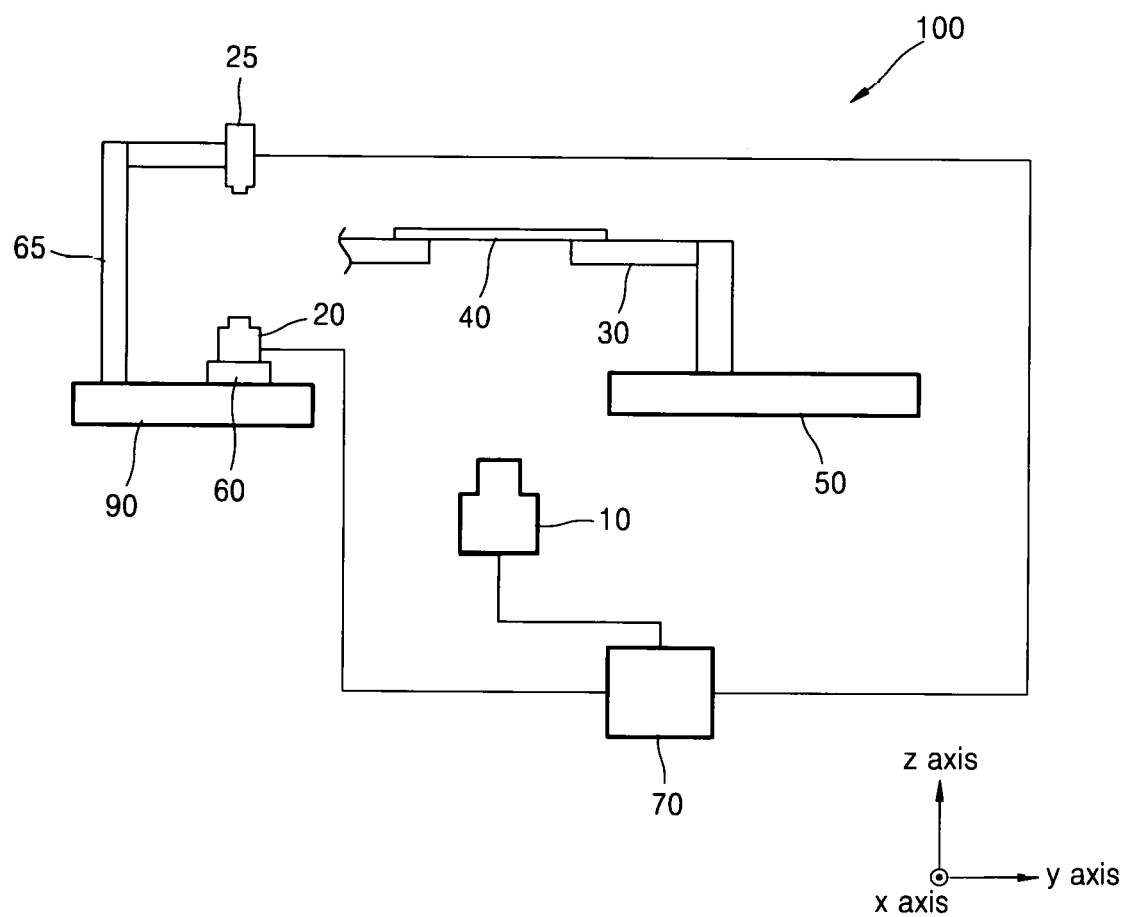
FIG. 1 schematically illustrates a marking position correcting apparatus according to an embodiment of the present invention.

According to an embodiment of the present disclosure, an apparatus for correcting a marking position of a wafer includes a support configured to support a processing film for position correction, a laser head configured to emit a laser beam to the processing film for position correction to form a pattern, a vision camera configured to obtain pattern position information, a movable table configured to move the support in a horizontal direction, and a controller configured to compare and match the pattern position information and marking position information set in the laser head.

The pattern may include a plurality of first lines parallel to each other and a plurality of second lines parallel to each other and perpendicular to the first lines, and the first lines and the second lines may form a plurality of intersecting points.

The vision camera may obtain information about positions of the plurality of intersecting points.

The support may include an opening through which the laser beam passes and is irradiated to the processing film for position correction.

The movable table may move the support in the horizontal direction such that the processing film for position correction is exposed to the laser head or the vision camera through the opening.

The processing film for position correction may have a rectangular shape, and the opening may have a rectangular shape corresponding to the processing film for position correction.

The opening may have a size greater than that of the wafer.

The vision camera and the laser head may be provided on a same side with respect to the processing film for position correction.

The apparatus may further include an auxiliary vision camera provided on an opposite side to the vision camera with respect to the processing film for position correction.

The apparatus may further include an adjustment table configured to adjust a position of the vision camera to align a center of the vision camera with a center of the auxiliary vision camera.

According to an embodiment of the present disclosure, a method of correcting a marking position of a wafer includes matching a coordinate system of a vision camera with a coordinate system of a laser head, placing a processing film for position correction on a support, forming a pattern by emitting a laser beam from the laser head to the processing film for position correction, obtaining pattern position information by using the vision camera, and comparing and matching the pattern position information and marking position information set in the laser head.

The matching of the coordinate system of the vision camera and the coordinate system of the laser head may include placing a jig on the support, the jig having a center point at a central portion thereof, adjusting the vision camera such that the center point is located at a center of the coordinate system of the vision camera, and by emitting a laser beam to the center point, adjusting the laser head such that a center of the coordinate system of the laser head matches the center point.

The method may further include adjusting an auxiliary vision camera such that the center point is located at a center of a coordinate system of the auxiliary vision camera, wherein the auxiliary vision camera is provided on an opposite side to the vision camera with respect to the processing film for position correction.

The support may include an opening, and the support may be moved in a horizontal direction such that the jig is exposed to the laser head or the vision camera through the opening.

The pattern may include a plurality of first lines parallel to each other and a plurality of second lines parallel to each other and perpendicular to the first lines, and the first lines and the second lines may form a plurality of intersecting points.

In the obtaining of the pattern position information, information about positions of the plurality of intersecting points may be obtained.

The support may include an opening through which the laser beam passes and is irradiated to the processing film for position correction.

The support may be moved in the horizontal direction such that the processing film for position correction is exposed to the laser head or the vision camera through the opening.

The processing film for position correction may have a rectangular shape, and the opening may have a rectangular shape corresponding to the processing film for position correction.

The opening may have a size greater than that of the wafer.

MODE OF THE INVENTION

Embodiments are provided to further completely explain the present disclosure to one of ordinary skill in the art to which the present disclosure pertains. However, the present disclosure is not limited thereto and it will be understood that various changes in form and details may be made therein without departing from the spirit and scope of the following claims. That is, descriptions on particular structures or functions may be presented merely for explaining embodiments of the present disclosure. In the drawings, a part that is not related to a description is omitted to clearly describe the present disclosure and, throughout the specification, similar parts are referenced with similar reference numerals.

In the present specification, when a constituent element "connects" or is "connected" to another constituent element, the constituent element contacts or is connected to the other constituent element not only directly, but also electrically through at least one of other constituent elements interposed therebetween. Also, when a part may "include" a certain constituent element, unless specified otherwise, it may not be construed to exclude another constituent element but may be construed to further include other constituent elements.

FIG. 1 schematically illustrates a marking position correcting apparatus 100 according to an embodiment of the present invention.

Referring to FIG. 1, the marking position correcting apparatus 100 may include a laser head 10, a vision camera 20, an auxiliary vision camera 25, a support 30 supporting a processing film 40 for correction of a position, a movable table 50, an adjustment table 60, a controller 70, and a fixed table 90.

A pattern may be formed on the processing film 40 for correction of a position by a laser beam emitted from the laser head 10. The processing film 40 for correction of a position may have a certain level of hardness so as not to be deformed when placed in an opening of the support 30. The processing film 40 for correction of a position may be a film or plate of a silver color which may be discolored when a laser beam is irradiated thereto, thereby indicating a portion where the laser beam is irradiated. Furthermore, the processing film 40 for correction of a position may have a rectangular shape.

The laser head 10 may emit a laser beam. The laser head 10 may be arranged under the support 30 and may perform a marking position correction operation by emitting a laser beam to the processing film 40 for correction of a position exposed through the opening of the support 30. A laser system including the laser head 10 may include a laser oscillator (not shown) for generating a laser beam, a reflective mirror (not shown) for forming a path to guide the laser beam output from the laser oscillator toward a lower side of the support 30, a Galvanometer scanner (not shown) for deflecting the laser beam by a certain angle, and an f-theta lens (not shown) for correcting aberration of the laser beam. The laser beam output from the laser head 10 may form a pattern on the processing film 40 for correction of a position. Furthermore, after the marking position correction operation is completed, the laser head 10 may perform a marking operation by emitting a laser beam for processing to chips on a wafer exposed through the opening of the support 30.

The vision camera 20 may obtain information about a position of the pattern formed, by the laser beam, on the processing film 40 for correction of a position. The shape of the pattern formed by the laser beam may include a plurality of first lines parallel to each other and a plurality of second lines parallel to each other, the second lines being perpendicular to the first lines. The first lines and the second lines intersect each other, forming a plurality of intersecting points. The vision camera 20 may obtain information about the position of an intersecting point. Furthermore, the vision camera 20 may be provided on the same side as the laser head 10 with respect to the processing film 40 for correction of a position.

The auxiliary vision camera 25 may be provided on the opposite side to the vision camera 20 with respect to the processing film 40 for correction of a position. The vision camera 20 and the auxiliary vision camera 25, which are disposed at opposite sides with respect to the processing film 40 for correction of a position, may obtain the information about a position of the pattern formed on the processing film 40 for correction of a position from both of an upper surface and a lower surface of the processing film 40 for correction of a position.

The adjustment table 60 is connected to the vision camera 20 and may align the vision camera 20 with the auxiliary vision camera 25. As the vision camera 20 is finely moved by the driving of the adjustment table 60, the center of a coordinate system of the vision camera 20 may be matched with the center of a coordinate system of the auxiliary vision camera 25. When the vision camera 20 is moved by the driving of the adjustment table 60, the fixed table 90 and the auxiliary vision camera 25 connected to the fixed table 90 may be maintained in a fixed state.

After the marking position correction operation is completed, the vision camera 20 and the auxiliary vision camera 25 take images of semiconductor chips provided on a wafer and recognize positions of the semiconductor chips. The positions of chips are recognized from information about the positions of the recognized semiconductor chips, and thus a marking operation may be performed on the semiconductor chips by using a laser beam output from the laser head 10.

The movable table 50 may move the support 30. The movable table 50 may move the support 30 in a horizontal direction, that is, a surface parallel to an x-y plane. The movable table 50 may move the support 30 in the horizontal direction to expose the processing film 40 for correction of a position to the laser head 10 or the vision camera 20 through the opening formed in the support 30.

The controller 70 may compare the pattern position information obtained by the vision camera 20 and marking position information previously set in the laser head 10 to emit a laser beam and, when a difference therebetween is over a certain value, control the marking position correcting apparatus 100 to match the position of a pattern with the set marking position. The controller 70 may match the position of a pattern with the set marking position by adjusting the position of a mirror (not shown) of a Galvanometer scanner (not shown).

Figure 2:
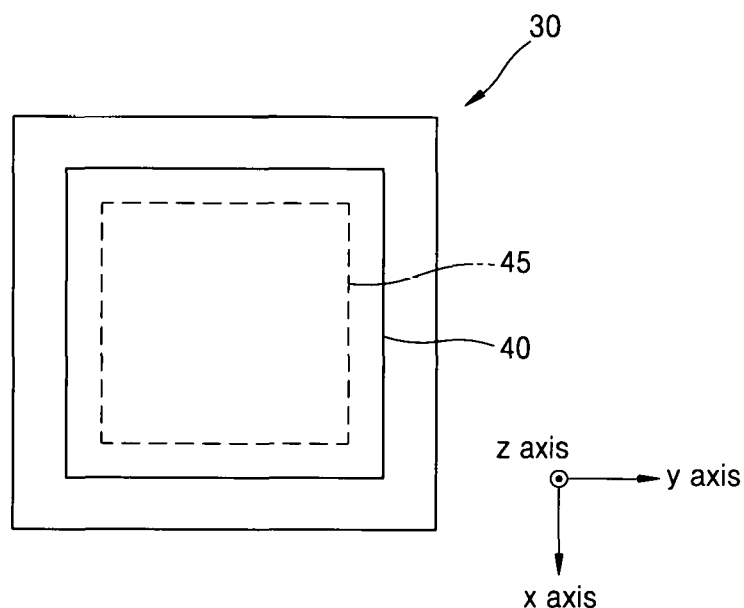
FIG. 2 is a plan view of a support illustrated in FIG. 1 and used for a marking position correction operation.

FIG. 2 is a plan view of the support 30 illustrated in FIG. 1 and used for a marking position correction operation.

Referring to FIG. 2, the support 30 may support the processing film 40 for correction of a position. The support 30 may include an opening 45 through which a laser beam passes and is irradiated to the processing film 40 for correction of a position. In order for the support 30 to support the processing film 40 for correction of a position, the size of the opening 45 may be less than that of the processing film 40 for correction of a position, and the opening 45 may have a rectangular shape corresponding to the processing film 40 for correction of a position. Furthermore, the opening 45 may have a size larger than that of the wafer in order to perform the marking position correction operation on all positions on a wafer corresponding to position information of the processing film 40 for correction of a position through the marking position correction operation using the processing film 40 for correction of a position exposed by the opening 45.

Figure 3:
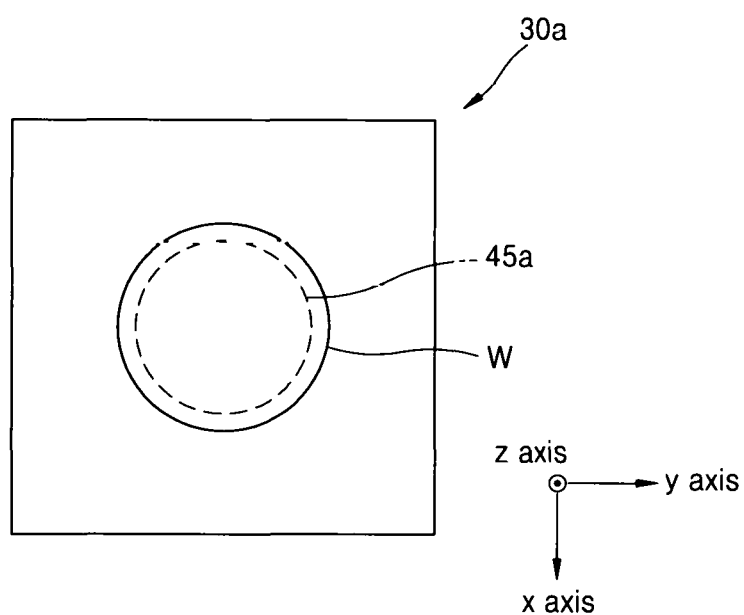
FIG. 3 is a plan view of a support used when a marking operation is performed on a wafer.

FIG. 3 is a plan view of a support 30a used when a marking operation is performed on a wafer W.

Referring to FIG. 3, when the marking position correction operation is completed, the support 30 used for the marking position correction operation may be replaced with the support 30a on which the wafer W is placed and a marking operation is performed. In order for the support 30a to support the wafer W, the size of the opening 45a of the support 30a may be less than that of the wafer W. The opening 45a may have a circular shape corresponding to the wafer W. After the replacement, a marking operation may be performed by irradiating chips on the wafer W exposed through the opening 45a of the support 30a, with a laser beam for processing.

Figure 4:
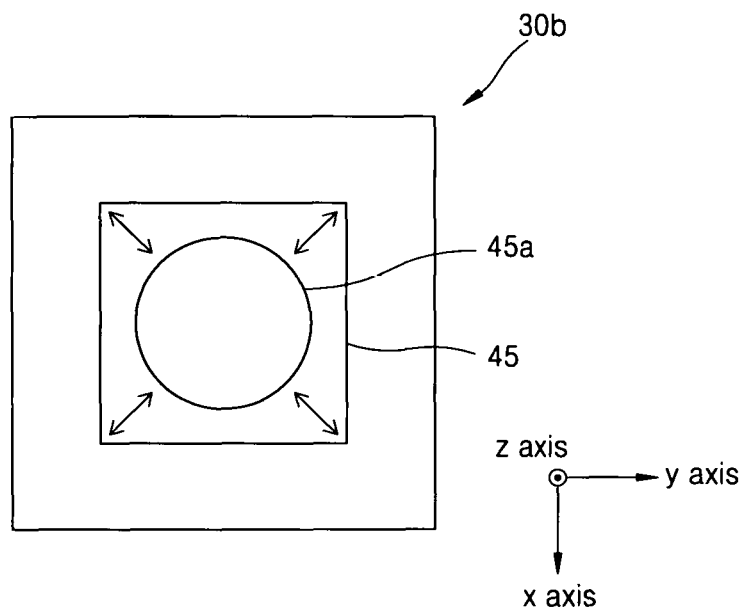
FIG. 4 is a plan view of a support used for performing both a marking operation and a marking position correction operation on a wafer.

FIG. 4 is a plan view of a support 30b used for performing both a marking operation and a marking position correction operation on a wafer.

Referring to FIG. 4, the support 30b may include two interchangeable openings 45 and 45a. The support 30b is provided with the opening 45 for a marking position correction operation and then the processing film 40 for correction of a position is placed on the support 30b, and thus a marking position correction operation is performed. When the marking position correction operation is completed, the opening of the support 30b may be converted from the opening 45 for a marking position correction operation to the opening 45a for a marking operation. After the conversion, a wafer is placed on the support 30b where the opening 45a for a marking operation is formed, and thus a marking operation may be performed. The conversion from the opening 45 for a marking position correction operation to the opening 45a for a marking operation may be made by mechanical driving of the support 30b. For example, the conversion of the opening may be made by using a slide apparatus, but the present disclosure is not limited thereto.

Figure 5A:
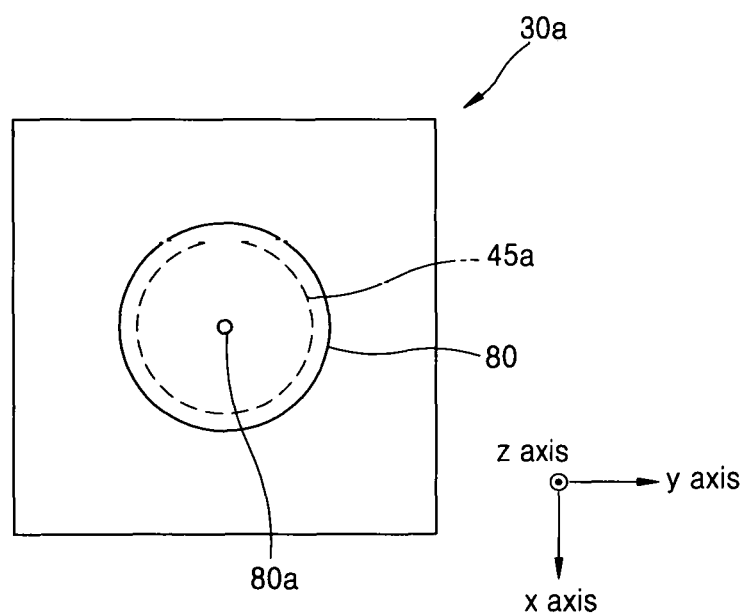
FIG. 5A is a plan view of a jig used to match a coordinate system of a vision camera and a coordinate system of a laser head.

FIG. 5A is a plan view of a jig 80 used to match a coordinate system of the vision camera 20 with a coordinate system of the laser head 10.

Referring to FIG. 5A, the jig 80 has a center point 80a at a central portion thereof. The center point 80a may be formed by penetrating through the central portion of the jig 80, and may allow a laser beam and light to pass therethrough. The jig 80 may have the same shape as the wafer W, but the present disclosure is not limited thereto. For example, the jig 80 may have a rectangular shape. The coordinate system of the vision camera 20 and the coordinate system of the laser head 10 may be matched with each other by adjusting the vision camera 20 such that the center point 80a is located at the center of the coordinate system of the vision camera 20, and adjusting the laser head 10 such that the center of the coordinate system of the laser head 10 is matched with the center point 80a by using a laser beam emitted from the laser head 10 to the center point 80a.

Figure 5B:
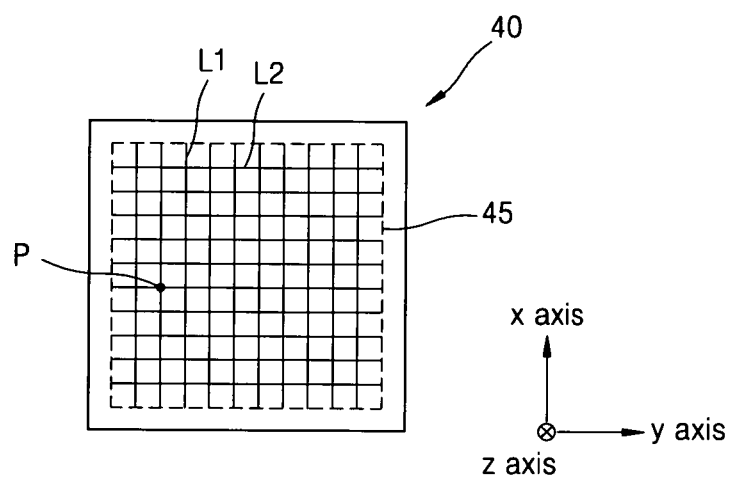
FIG. 5B illustrates a pattern formed on a processing film for position correction.

FIG. 5B illustrates a pattern formed on the processing film 40 for correction of a position.

Referring to FIG. 5B, the shape of the pattern formed by the laser beam may include a plurality of first lines L1 parallel to each other and a plurality of second lines L2 parallel to each other and perpendicular to the first lines L1. The first lines L1 and the second lines L2 intersect each other, forming a plurality of intersecting points P. The vision camera 20 may obtain position information of the intersecting points P.

FIGS. 6A to 6D illustrate a process of correcting a marking position, according to an embodiment of the present invention.

Figure 6A:
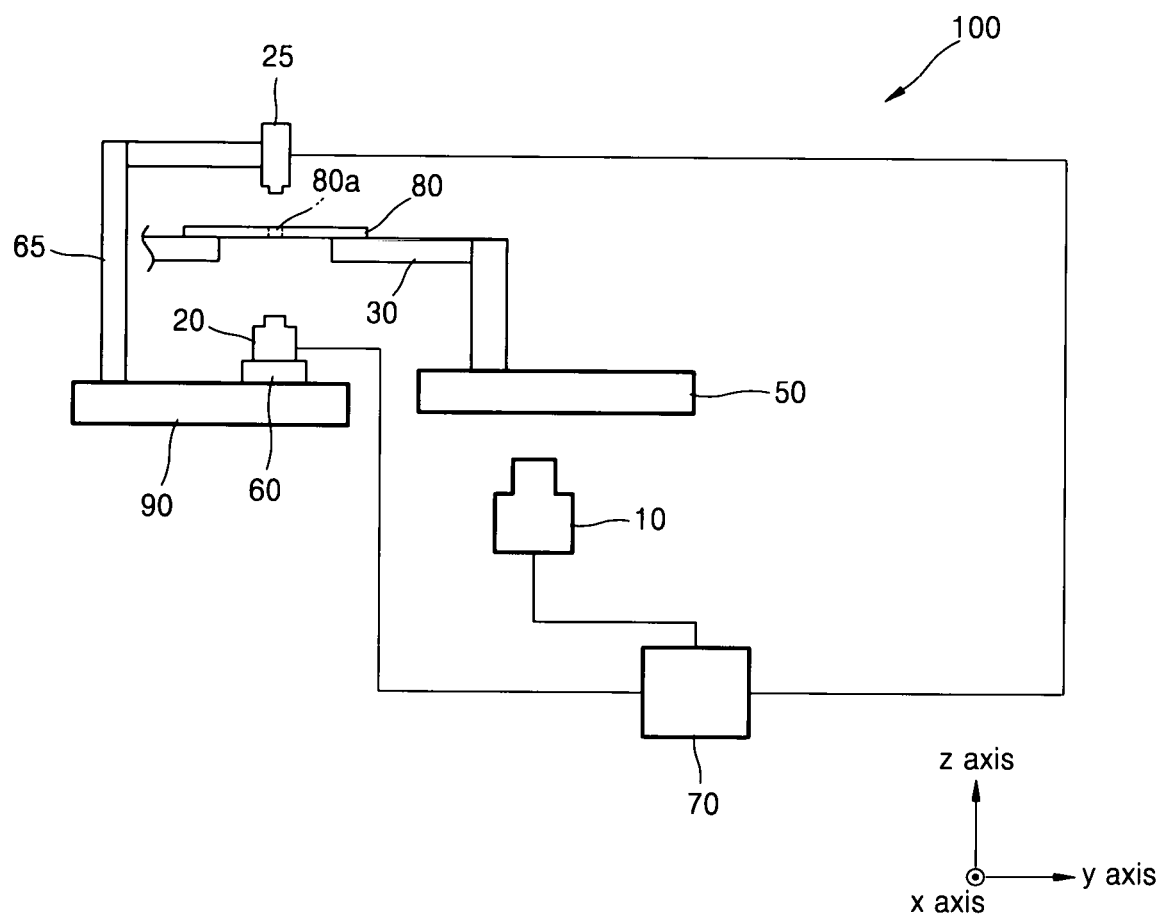
FIGS. 6A to 6D illustrate a process of correcting a marking position, according to an embodiment of the present invention.

Referring to FIG. 6A, first, the jig 80 having the center point 80a at a center portion thereof is placed on the support 30. The movable table 50 may move the support 30 in the horizontal direction such that the jig 80 is located between the vision camera 20 and the auxiliary vision camera 25 through the opening formed in the support 30. Next, the vision camera 20 may be adjusted such that the center point 80a is located at the center of the coordinate system of the vision camera 20. Furthermore, the auxiliary vision camera 25 may be adjusted such that the center point 80a is located at the center of the coordinate system of the auxiliary vision camera 25 provided on the opposite side to the vision camera 20 with respect to the jig 80. The adjustments of the vision camera 20 and the auxiliary vision camera 25 may be performed by the driving of the adjustment table 60. Accordingly, the center of the coordinate system of the vision camera 20 and the center of the coordinate system of the auxiliary vision camera 25 may match each other.

Figure 6B:
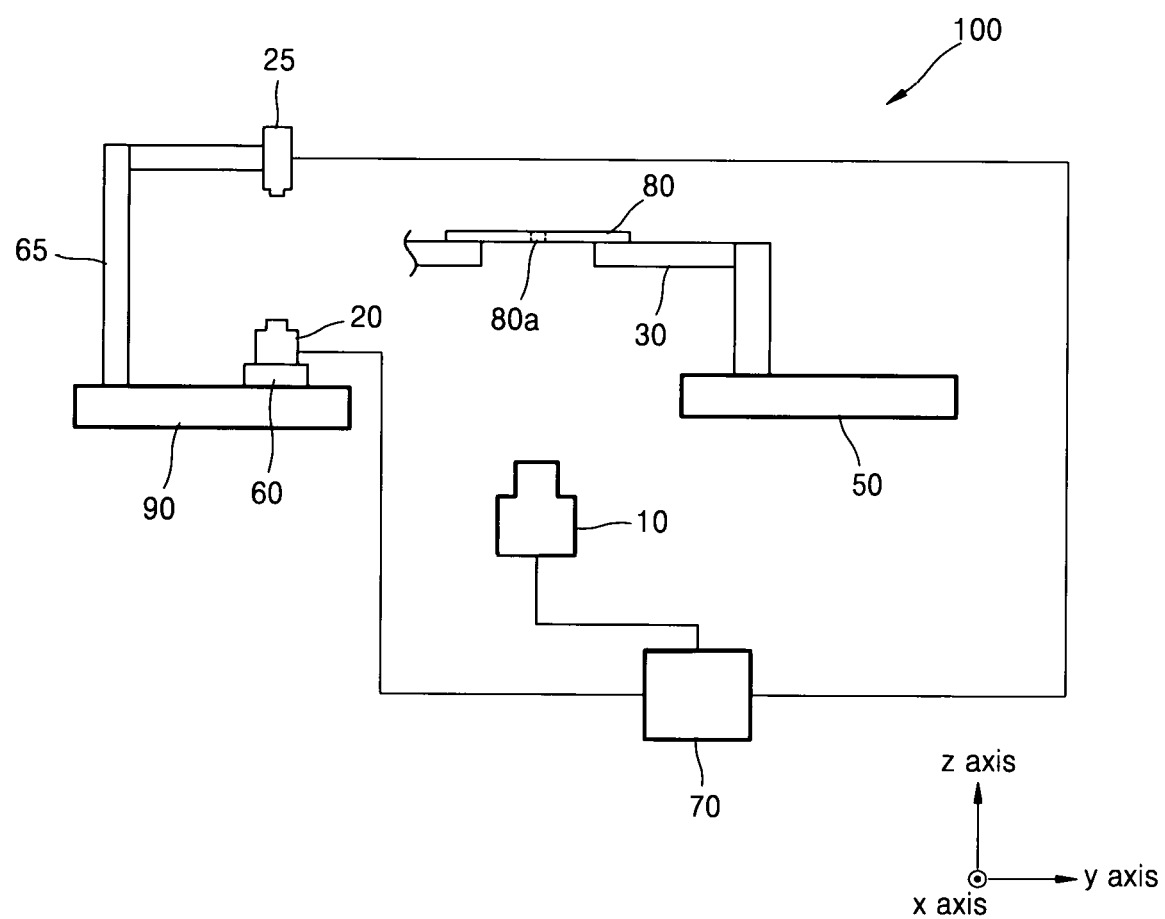

Next, referring to FIG. 6B, the movable table 50 move the support 30 in the horizontal direction such that the jig 80 is exposed to the laser head 10 through the opening formed in the support 30. After movement, the laser head 10 emits a laser beam to the center point 80a, and thus the laser head 10 may be adjusted such that the center of the coordinate system of the laser head 10 matches the center point 80a. As a result, the coordinate system of the vision camera 20, the coordinate system of the auxiliary vision camera 25, and the coordinate system of the laser head 10 may all be matched with one another.

Figure 6C:
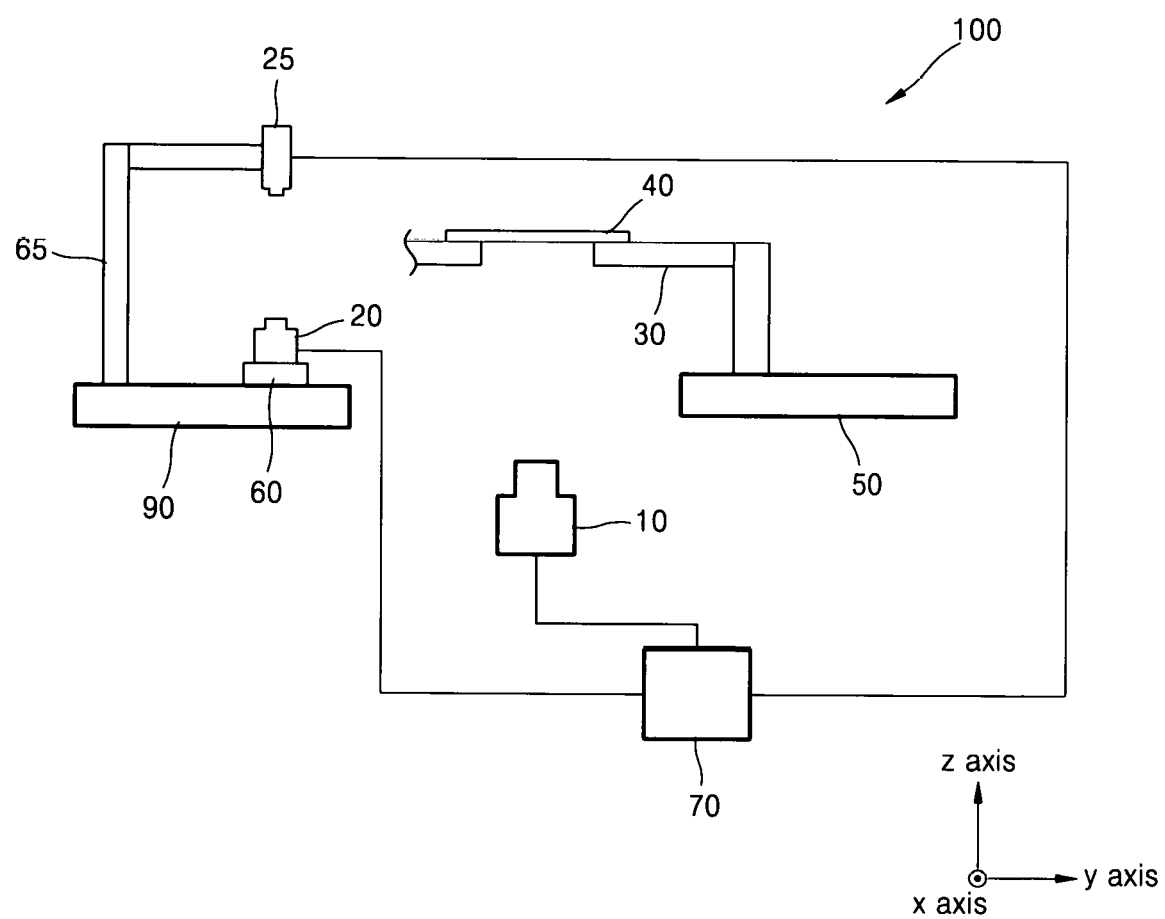

Next, referring to FIG. 6C, the jig 80 is removed from the support 30, and the processing film 40 for correction of a position is placed on the support 30. The laser head 10 emits a laser beam to the processing film 40 for correction of a position to thereby form a pattern on the processing film 40 for correction of a position. The shape of the formed pattern may include, as illustrated in FIG. 5B, the first lines L1 parallel to each other and the second lines L2 parallel to each other and perpendicular to the first lines L1. The first lines L1 and the second lines L2 intersect each other, forming the intersecting points P.

Figure 6D:
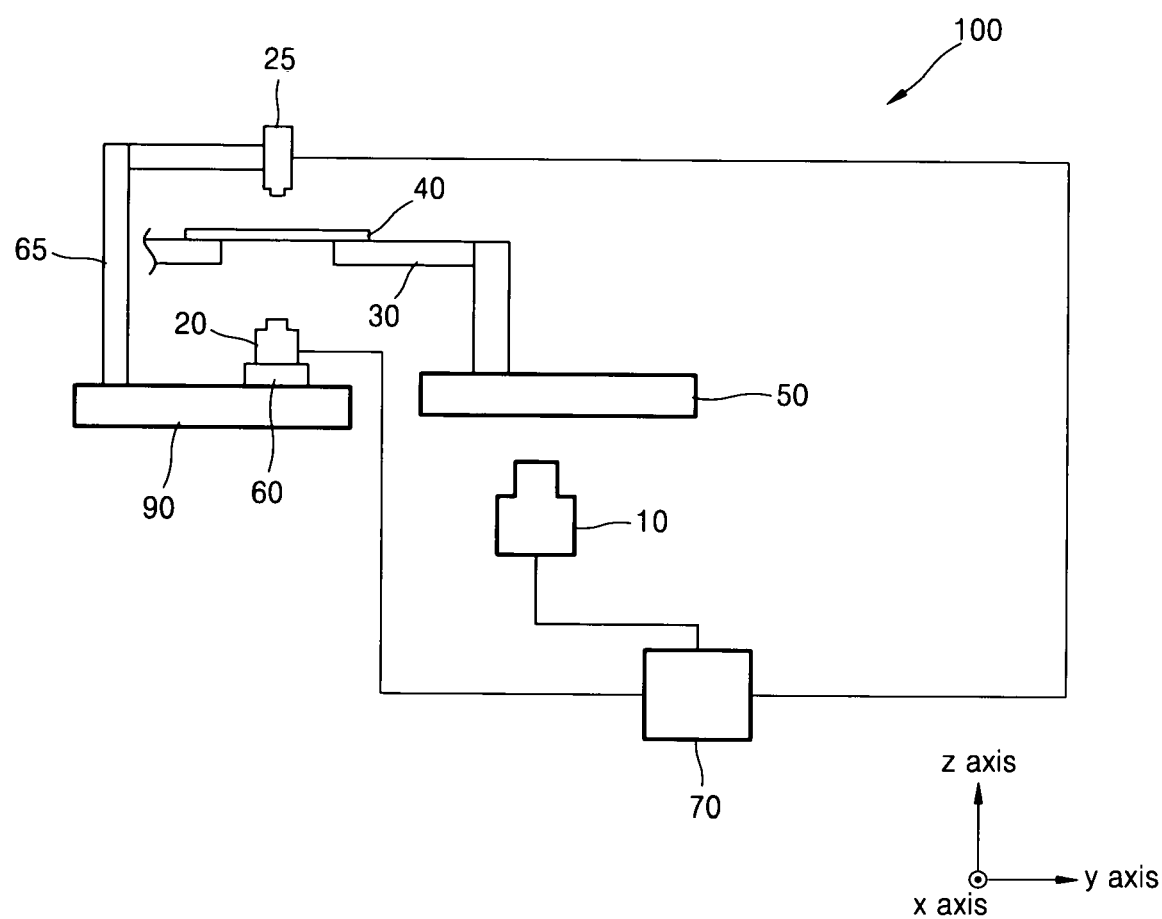

Next, referring to FIG. 6D, the movable table 50 moves the support 30 in the horizontal direction such that the processing film 40 for correction of a position is located between the vision camera 20 and the auxiliary vision camera 25 through the opening formed in the support 30. The vision camera 20 and the auxiliary vision camera 25 may obtain the information about a position of the pattern formed on the processing film 40 for correction of a position by the laser beam. The vision camera 20 may obtain information about the positions of the intersecting points P. Next, the controller 70 may compare the pattern position information obtained by the vision camera 20 and the auxiliary vision camera 25 with the marking position information previously set in the laser head 10 to emit a laser beam and, when a difference therebetween is over a certain value, control the marking position correcting apparatus 100 to match the position of a pattern and the set marking position. The controller 70 may match the position of a pattern and the set marking position by adjusting the position of a mirror (not shown) of a Galvanometer scanner (not shown).

According to the marking position correcting apparatus and the marking position correction method according to the above-described embodiments, before performing a marking operation on semiconductor chips provided on a wafer, a marking position is measured and corrected by using a processing film for position correction, and thus marking may be made at an accurate position on a semiconductor chip during a marking operation.

The above description of the present disclosure is provided as an example, and it will be understood that one of ordinary skill in the art to which the present disclosure pertains can easily modify the present disclosure into another detailed form without changing the technical concept or essential features of the present disclosure. Thus, the above-described embodiments are exemplary in all aspects and should not be for purposes of limitation. For example, each constituent element described to be a single type may be embodied in a distributive manner. Likewise, the constituent elements described to be distributed may be embodied in a combined form.

The scope of the present disclosure is defined not by the detailed description of the disclosure but by the appended claims, and all changes and modifications introduced from the concept and scope of the claims and the equivalent concept thereof will be construed as being included in the present disclosure.

The invention claimed is:

1. An apparatus for correcting a marking position of a wafer, the apparatus comprising:
   a support configured to support a processing film for position correction;
   a laser head configured to emit a laser beam to the processing film for position correction to form a pattern on the processing film;
   a vision camera configured to obtain information about a position of the pattern formed on the processing film;
   a movable table configured to move the support in a horizontal direction; and
   a hardware controller configured to compare and match the information about the position of the pattern formed on the processing film and marking position information set in the laser head,
   wherein the pattern formed on the processing film includes a plurality of first lines parallel to each other and a plurality of second lines parallel to each other and perpendicular to the first lines, and the first lines and the second lines form a plurality of intersecting points.

2. The apparatus of claim 1, wherein the vision camera obtains information about positions of the plurality of intersecting points.

3. The apparatus of claim 1, wherein the support includes an opening through which the laser beam passes and is irradiated to the processing film for position correction.

4. The apparatus of claim 3, wherein the movable table moves the support in the horizontal direction such that the processing film for position correction is exposed to the laser head or the vision camera through the opening.

5. The apparatus of claim 3, wherein the processing film for position correction has a rectangular shape, and the opening has a rectangular shape corresponding to the processing film for position correction.

6. The apparatus of claim 5, wherein the opening has a size greater than that of the wafer.

7. The apparatus of claim 1, wherein the vision camera and the laser head are provided on a same side with respect to the processing film for position correction.

8. The apparatus of claim 7, further comprising an auxiliary vision camera provided on an opposite side to the vision camera with respect to the processing film for position correction.

9. The apparatus of claim 8, further comprising an adjustment table configured to adjust a position of the vision camera to align a center of the vision camera with a center of the auxiliary vision camera.

10. A method of correcting a marking position of a wafer, the method comprising:
- matching a coordinate system of a vision camera with a coordinate system of a laser head;
- placing a processing film for position correction on a support;
- forming a pattern on the processing film by emitting a laser beam from the laser head to the processing film for position correction;
- obtaining information about a position of the pattern formed on the processing film by using the vision camera; and
- comparing and matching the information about the position of the pattern formed on the processing film and marking position information set in the laser head,
- wherein the pattern formed on the processing film includes a plurality of first lines parallel to each other and a plurality of second lines parallel to each other and perpendicular to the first lines, and the first lines and the second lines form a plurality of intersecting points.

11. The method of claim 10, wherein the matching of the coordinate system of the vision camera and the coordinate system of the laser head comprises:
- placing a jig on the support, the jig having a center point at a central portion thereof;
- adjusting the vision camera such that the center point is located at a center of the coordinate system of the vision camera; and
- by emitting a laser beam to the center point, adjusting the laser head such that a center of the coordinate system of the laser head matches the center point.

12. The method of claim 11, further comprising adjusting an auxiliary vision camera such that the center point is located at a center of a coordinate system of the auxiliary vision camera, wherein the auxiliary vision camera is provided on an opposite side to the vision camera with respect to the processing film for position correction.

13. The method of claim 11, wherein the support includes an opening, and the support is moved in a horizontal direction such that the jig is exposed to the laser head or the vision camera through the opening.

14. The method of claim 10, wherein, in the obtaining of the pattern position information, information about positions of the plurality of intersecting points is obtained.

15. The method of claim 10, wherein the support includes an opening through which the laser beam passes and is irradiated to the processing film for position correction.

16. The method of claim 15, wherein the support is moved in the horizontal direction such that the processing film for position correction is exposed to the laser head or the vision camera through the opening.

17. The method of claim 15, wherein the processing film for position correction has a rectangular shape, and the opening has a rectangular shape corresponding to the processing film for position correction.

18. The method of claim 17, wherein the opening has a size greater than that of the wafer.

* * * * *